United States Patent
Schmidt et al.

(10) Patent No.: US 7,241,020 B2
(45) Date of Patent: Jul. 10, 2007

(54) HIGH DEFINITION VEHICULAR MIRROR

(75) Inventors: William Schmidt, Newport, MI (US); Daniel M. Swain, Southgate, MI (US)

(73) Assignee: Mirror Lite, Rockwood, MI (US)

( * ) Notice: Subject to any disclaimer, the term of this patent is extended or adjusted under 35 U.S.C. 154(b) by 85 days.

(21) Appl. No.: 10/908,038

(22) Filed: Apr. 26, 2005

(65) Prior Publication Data

US 2005/0180034 A1 Aug. 18, 2005

Related U.S. Application Data

(63) Continuation-in-part of application No. 10/708,123, filed on Feb. 10, 2004, now Pat. No. 7,134,759.

(51) Int. Cl.
*G02B 5/08* (2006.01)
*G02B 5/10* (2006.01)

(52) U.S. Cl. .................................. 359/866; 359/868

(58) Field of Classification Search ............... 359/868, 359/866, 871
See application file for complete search history.

(56) References Cited

U.S. PATENT DOCUMENTS

| 4,436,372 | A | * | 3/1984 | Schmidt et al. | 359/868 |
|---|---|---|---|---|---|
| 4,938,578 | A | * | 7/1990 | Schmidt et al. | 359/868 |
| 5,005,963 | A | * | 4/1991 | Schmidt et al. | 359/868 |
| 5,084,785 | A | * | 1/1992 | Albers et al. | 359/868 |
| 5,589,984 | A | * | 12/1996 | Schmidt et al. | 359/603 |
| 6,293,679 | B1 | * | 9/2001 | Schmidt et al. | 359/603 |
| 6,328,450 | B2 | * | 12/2001 | Englander | 359/853 |

* cited by examiner

*Primary Examiner*—Alessandro Amari
(74) *Attorney, Agent, or Firm*—John A. Artz; Artz & Artz, P.C.

(57) ABSTRACT

A vehicle mirror assembly having a housing or base member, a mirror lens and a gasket. The mirror lens is provided in the shape of a portion of an end of an ellipsoid. The lens has a varying radius of curvature. The center portion of the lens has a smaller radius of curvature than the outer portions along the major axis of the lens creating an improved field of view of the reflected image.

29 Claims, 5 Drawing Sheets

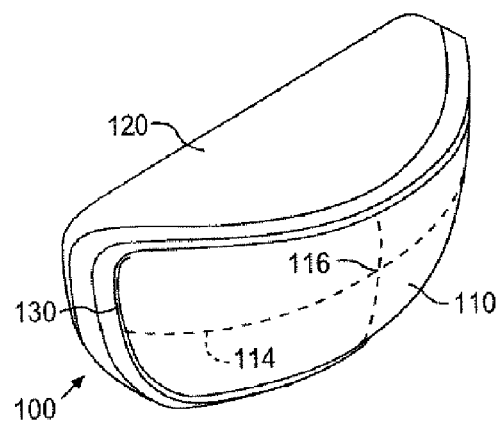 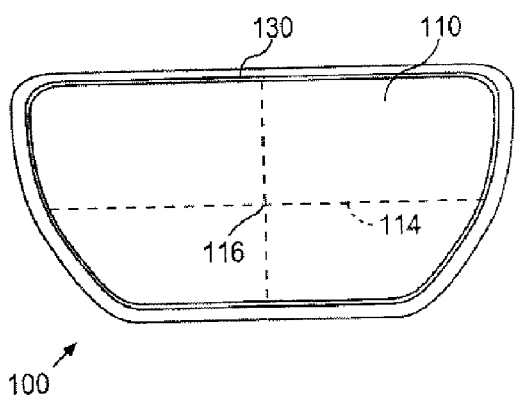
FIG.8　　　　FIG.9
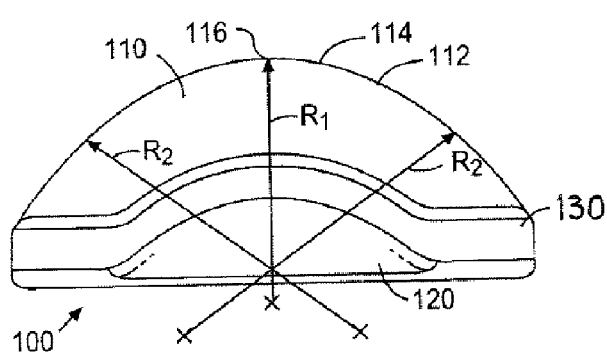 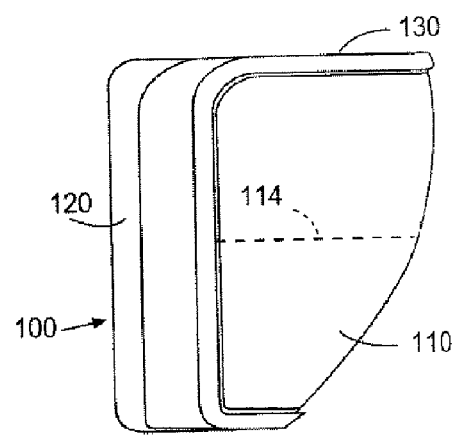
FIG.10　　　　FIG.11

HIGH DEFINITION VEHICULAR MIRROR

CROSS REFERENCE TO RELATED APPLICATIONS

This is a continuation-in-part of U.S. application Ser. No. 10/708,123 filed on Feb. 10, 2004 now U.S. Pat. No. 7,134,759.

TECHNICAL FIELD

The present invention relates generally to exterior automotive mirror assemblies and, more particularly, to front-end mounted exterior automotive ellipsoid mirrors which provide improved images.

BACKGROUND OF THE INVENTION

Automotive mirror assemblies can play a vital role in vehicle operation. Placement of the vehicle operator within the vehicle structure often makes direct line-of-sight to surrounding vehicle areas impractical. Yet such visual inspections of surrounding areas can provide the vehicle operator with information necessary for proper vehicle operation. As vehicle size increases, so often does the difficulty of accurate visual inspections. Vehicles, such as school buses and commercial vans, often utilize increased vehicle sizes while requiring visual inspection of areas in front of and to the side of the vehicle. To this end, it is well known that vehicle mirrors may be front-end mounted to the vehicle to provide the widest possible field of view around the vehicle.

Early attempts at widening the operator's field of view focused on the use of convex mirrors. By increasing the size of the convex mirror, it was discovered that the field of view could be increased. Unfortunately, increasing the size of the convex mirror is inefficient as the mirror itself begins to become an obstruction to forward viewing. To accommodate the need for increased field of view without negatively impacting mirror size, it is known that a domed mirror lens may incorporate a varying radius of curvature along one of either the major or minor axis. The varying radius of curvature achieves a compacted wide field of view or viewing area within minimal space such that the driver can look forward of the vehicle with minimal blockage of vision. These mirrors with varying radius of curvature along one axis are commonly referred to as cross-over mirrors.

Although the use of cross-over mirror designs has proven highly successful in the increase of viewing area while minimizing mirror size, present designs still can incorporate drawbacks. One of the drawbacks of these common cross-over mirror designs results from the reflection of the vehicle itself within the mirror. In many designs, the vehicle reflection is positioned within the center of the mirror and fills a significant amount of valuable viewing space. This results in a reduction of useful mirror surface area since the user does not commonly need to monitor reflection of the vehicle itself. Furthermore, images reflected in the mirror along the front and side of the vehicle often appear in the perimeter regions of the mirror. The reflections in the perimeter regions are commonly reduced in proportion due to decreasing surface radius of curvature in these regions of the mirror. This can result in undesirably distorted images with reduced image proportions such as long thin images. The reduction in image proportion can result in an increased strain on the driver to differentiate the objects reflected in these regions.

It would, therefore, be highly desirable to have a mirror assembly that reduces the size or amount of vehicle reflection in the mirror reflective surface area and increases the size and amount of reflection of the other areas. It would further be highly desirable to have a mirror assembly that improves image proportional reflection along the mirror perimeter to facilitate improved recognition.

SUMMARY OF THE INVENTION

A vehicle mirror assembly is provided comprising a base. The base comprises a first base portion defined by a first base longitudinal line and a first base periphery. The first base portion has a first base radius of curvature. The base further includes a second base portion defined by the first base longitudinal line and a second base periphery. The second base portion has a second base radius of curvature. A dome lens conforms to the base. The dome lens has a varying dome lens radius of curvature. The dome lens comprises a center surface portion having a center surface radius of curvature. The center surface radius is corresponding to a position on said dome lens aligned with a first base longitudinal midpoint to said dome lens and is perpendicular to the first base longitudinal line. A peripheral surface portion has a peripheral surface radius of curvature corresponding to the first base periphery. The peripheral surface radius of curvature is greater than the center surface radius of curvature.

In a preferred embodiment, the mirror lens is formed as a portion of an end section of an ellipsoid. With the present invention, the reflected image of the vehicle can be reduced 25% or more, while objects adjacent the outer perimeter of the reflected image can have the sizes of their images increased by 50% or more.

Other features of the present invention will become apparent when viewed in light of the detailed description of the preferred embodiment when taken in conjunction with the attached drawings and appended claims.

BRIEF DESCRIPTION OF THE DRAWINGS

FIG. 8-11 illustrate a perspective view, a front elevational view, a top elevational view and a side elevational view, respectively, of a preferred embodiment of a mirror assembly in accordance with the present invention.

DESCRIPTION OF THE PREFERRED EMBODIMENT(S)

Figure 1:
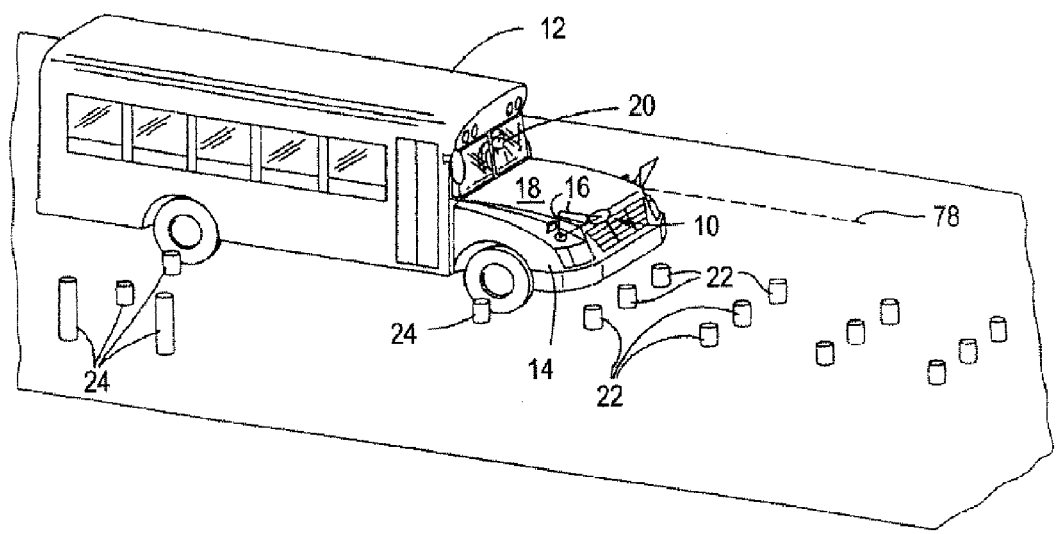
FIG. 1 is an illustration of an ellipsoid vehicle mirror assembly in accordance with the present invention mounted on a vehicle.

Referring now to FIG. 1, which is an illustration of an ellipsoid vehicle mirror assembly 10 in accordance with the present invention mounted on a vehicle 12. Although the ellipsoid vehicle mirror assembly 10 is illustrated mounted on a school bus, it should be understood that the present invention may be utilized in combination with a wide variety of vehicles for a wide variety of applications. The ellipsoid vehicle mirror assembly 10 is well suited for vehicles such as trucks and vans. Similarly, although the ellipsoid vehicle mirror assembly 10 may be mounted in a variety of locations on the vehicle 12, one preferred embodiment contemplates mounting the ellipsoid vehicle mirror assembly 10 on one or both of the front corners 14 of the vehicle 12. Mounting brackets 16 are used to attach the ellipsoid vehicle mirror assembly 10 to the vehicle surface 18.

When the ellipsoid vehicle mirror assembly 10 is mounted on the front corner 14 of the vehicle 12, it can provide the driver 20 with a field of view that encompasses both front-of-vehicle objects 22 and side-of-vehicle objects 24. The present invention provides advantages to the driver's 20 field of view by improving the reflected view of the front-of-vehicle objects 22 and the side-of-vehicle objects 24. This is accomplished through the unique geometric configuration of the ellipsoid vehicle mirror assembly 10. The ellipsoid vehicle mirror assembly 10 is comprised of a base 26 (see FIG. 2). The base 26 in turn includes a first base portion 28 and a second base portion 30. In the particular embodiment illustrated, the first base portion 28 and the second base portion 30 are perpendicular to one another. It should be understood, however, that in alternate embodiments the base portions 28,30 may be formed parallel (see FIG. 3) or at any of a variety of angles relative to each other.

The first base portion 28 is defined by a first base longitudinal line 32 and a first base periphery 34. The first base periphery 34 is defined by a first base radius of curvature 36. The second base portion 30 is defined by the first base longitudinal line 32 and a second base periphery 38 having a second base radius of curvature 40. It should be understood that when the base portions 28,30 are parallel, the first base longitudinal line 32 will not represent a visible dividing point. A dome lens 42 conforms to the base 26 and includes a varying dome lens radius of curvature 44. The dome lens 42 is a reflective convex surface with reflective mirror properties. A wide variety of configurations and manufacturing methodologies are known for producing such a dome lens 42 and are contemplated by the present invention.

The present mirror dome lens 42 may be manufactured from any suitable "silverized" plastic by any suitable mode such as injection molding vacuum forming or the like. The materials of construction are preferably selected such that upon formation there is no collapse at the central portion of the lens to thus eliminate the potential of negative curvatures and distortion thereat. Injection molding may be utilized in order to mold the lens 42 to desired specifications. It should be understood, however, that a variety of manufacturing methodologies may be utilized to implement the present invention.

The dome lens 42 is formed with a unique geometry to provide positive field of view advantages in combination with improved image proportions. This is accomplished by forming the dome lens 42 as a major-axis tip portion 46 of an ellipsoid 48 (see FIG. 4). The major-axis tip portion 46 comprises a portion of an ellipsoid 48 formed by dividing the ellipsoid 48 generally across the major axis 50. The major-axis portion 46 of the ellipsoid 48 preferably includes an ellipsoid tip point 52 as defined where the major axis 50 intersects the ellipsoid perimeter 54. Although a wide variety of ellipsoids 48 are contemplated by the present invention, one embodiment contemplates the use of an ellipsoid 48 with an approximately 82 inch major axis 50 and a 29 inch minor axis 56. In this arrangement, the minor axis 56 is contemplated to be less than half of the major axis 50. The dome depth 58, in this example, is approximately 4.3 inches. It should be understood that these dimensions and proportions are illustrative and are not meant as limitations to the present invention except as specifically claimed.

Although the ellipsoid 48 may be dimensioned and divided in a variety of fashions, one embodiment contemplates that the first base portion 28 divides the ellipsoid 48 perpendicular to the major axis 50. In this embodiment the first base radius of curvature 36 is constant. When the second base portion 30 is perpendicular to the first base portion 28 (as in FIG. 2) the second base portion is then coincident with the major axis 50 and the ellipsoid tip point 52 is positioned on the second base periphery 38 at a position perpendicular to the first base longitudinal midpoint 60. In this embodiment, the ellipsoid tip point 52 is coincident with the second base periphery 38 and the second base radius of curvature 40 is varying. In the embodiment (see FIG. 3) wherein the first and second base portions 28,30 are parallel, both first and second base radius of curvature 36,40 are constant and the ellipsoid tip point 52 is positioned inbetween the first base periphery 34 and the second base periphery 38. It should be understood that the first and second baseline radius of curvatures 36, 40 in FIG. 3 are only constant when the ellipsoid 48 is divided perpendicular to the major axis 50. By using a non-perpendicular intersection 59 (see FIG. 4), the first and second baseline radius of curvatures 36, 40 in FIG. 3 would both vary.

Figure 5:
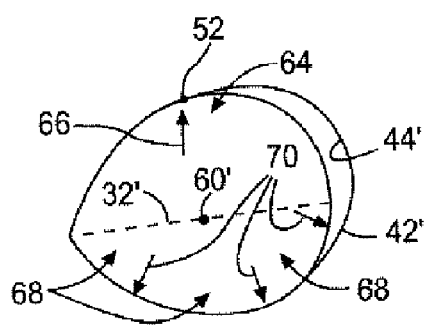
FIG. 5 is a front perspective view of the ellipsoid vehicle mirror illustrated in FIG. 2.

In still another contemplated embodiment (see FIG. 5), the ellipsoid tip point 52 is still between the first base periphery and the second base periphery, however, both the first base radius of curvature and the second base radius of curvature are varying. In such a case, it is conceived that the angle between the first and second baseline portions need not be perpendicular but may encompass a variety of angles. In addition, square cut bisected base and square of sliver formations are also contemplated.

The resultant described geometry results in a varying dome lens radius of curvature 44'. The varying radius of curvature 44' results in a the dome lens 42' having a center surface portion 64 (see FIGS. 5 and 6), a center surface radius of curvature 66 and a peripheral surface portion 68 having a peripheral radius of curvature 70. The center surface radius of curvature 66 corresponds to a position on the dome lens 42' aligned with the first base longitudinal midpoint 60' in a direction perpendicular to the first base longitudinal line 32'. The peripheral surface portion 68 corresponds to the first base periphery 34. The peripheral surface radius of curvature 70 is greater than the center surface radius of curvature 66. This in turn, as shown in FIG. 6, generates a first proportion image view 72 coincident with the center surface portion 64 and a second proportion image view 74 coincident with the peripheral surface portion 68.

The smaller radius of curvature of the center surface portion 64 therefore results in a view generating smaller image proportions than the peripheral surface portion 68. In this manner, when the mirror assembly 10 is positioned in the front corner 14 of the vehicle 12, it is preferably positioned such that the vehicle reflection 76 is reflected in the first proportion image view 72. The second proportion image view 74 preferably reflects both the front-of-vehicle objects 22 and the side-of-vehicle objects 24. Thus the vehicle 12 itself takes up a smaller portion of the mirror assembly 10 while the front-of-vehicle objects 22 and the side-of-vehicle objects 24 are reflected with improved proportions.

Figure 6:
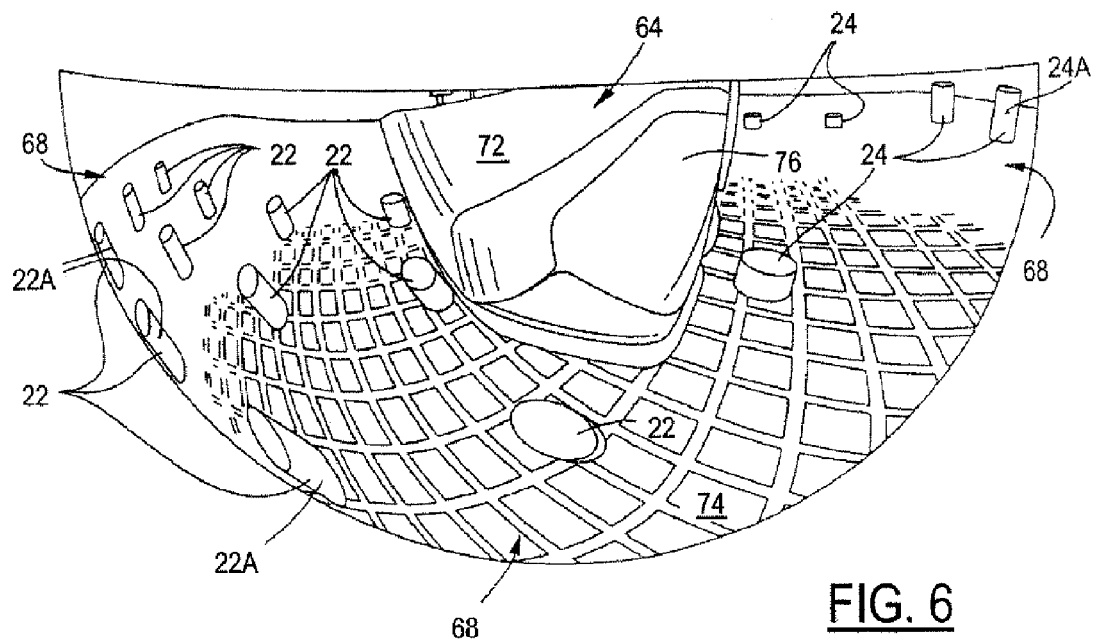
FIG. 6 is a perspective view of the ellipsoid vehicle mirror as shown in FIG. 1, the detail illustrating the proportional image views.
Figure 7:
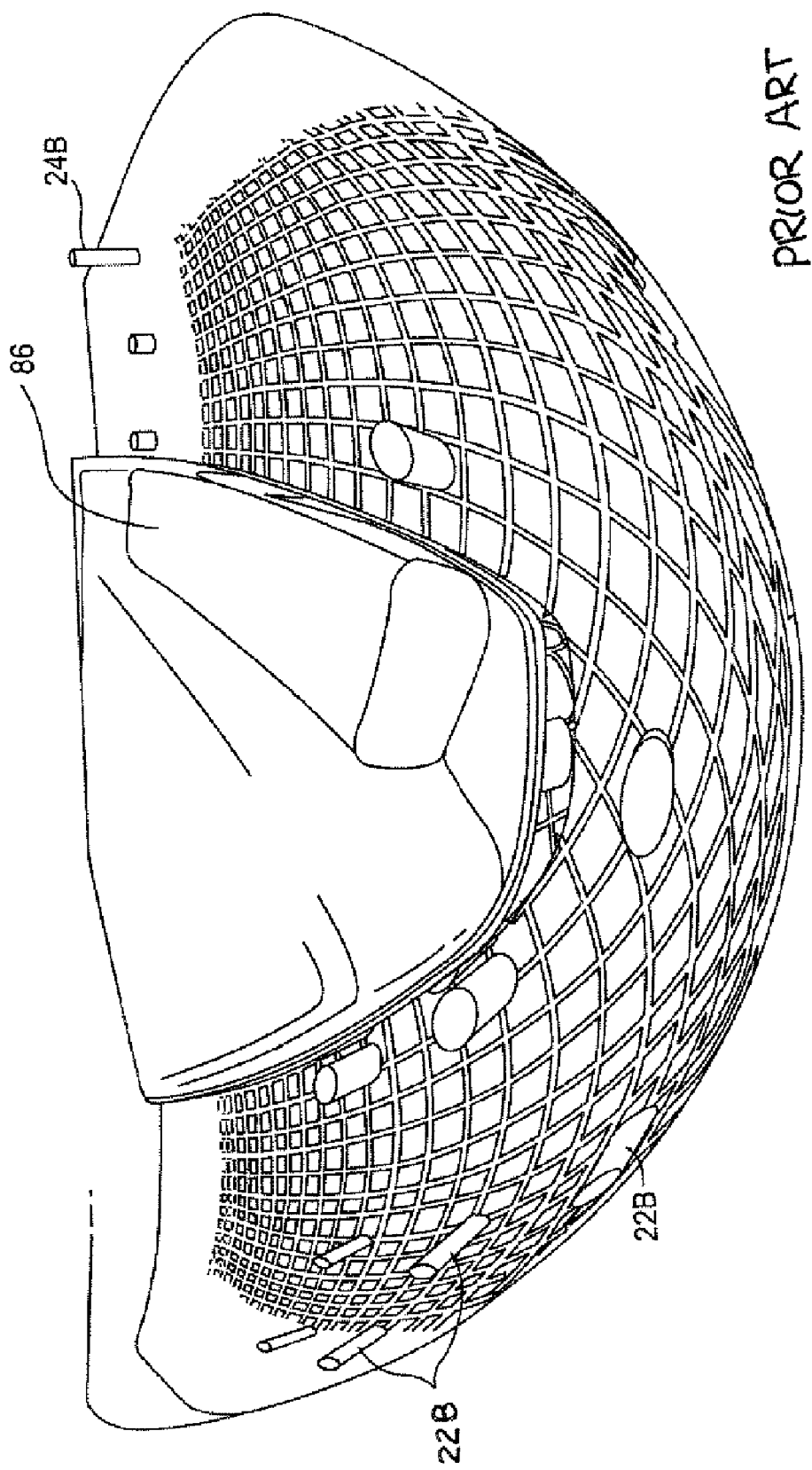
FIG. 7 is a perspective view illustrating the reflected image of a known mirror illustrating the proportional image view.
Figure 12:
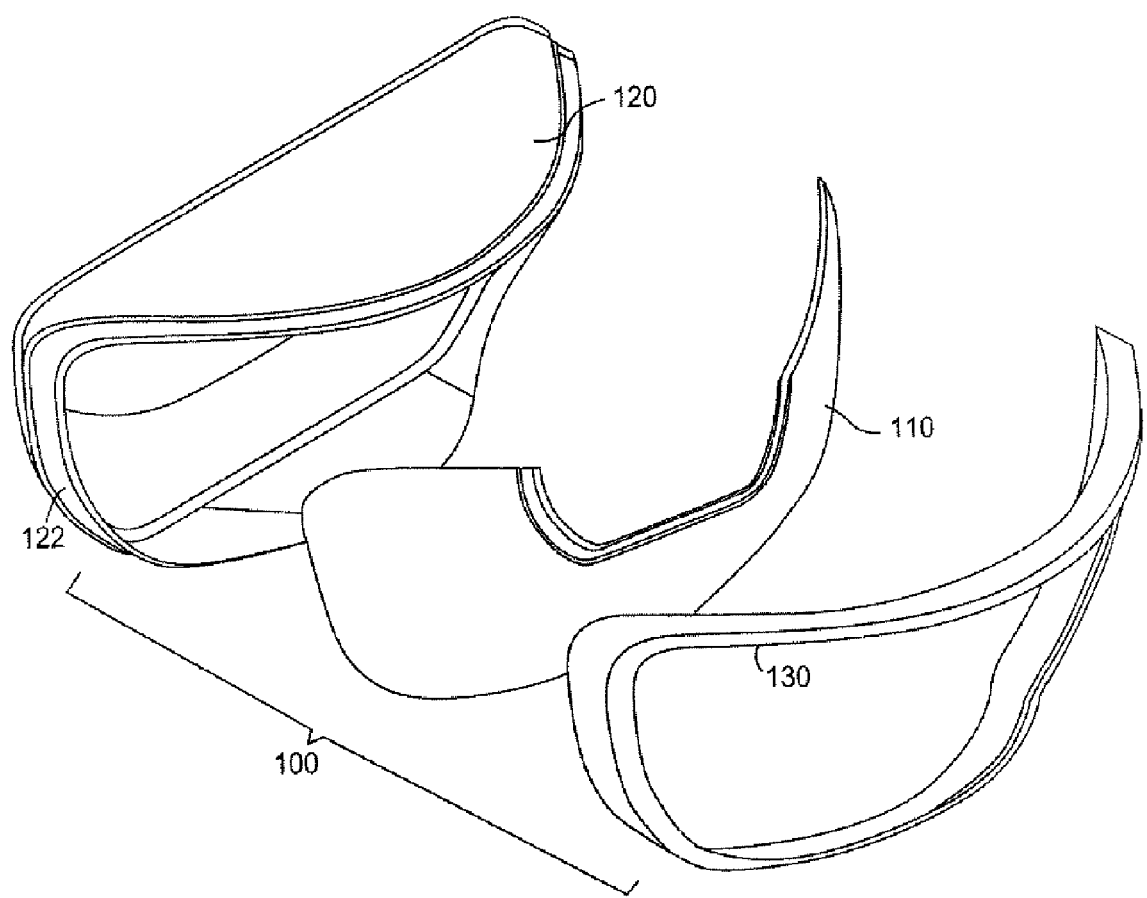
FIG. 12 is an exploded perspective view of the mirror assembly depicted in FIGS. 8-11.

This benefits and advantages of the present invention are shown by a comparison of FIG. 6 with FIG. 7. FIG. 7 shows a corresponding reflected image view of a prior art mirror. The vehicle reflection 86 in FIG. 7 is approximately 25% larger than the vehicle reflection 76 of FIG. 6. In addition, the reflected image of post 24B in the prior art mirror (FIG. 7) is significantly smaller (approximately 50% in width) than the reflected image of corresponding post 24A in the present inventive mirror (FIG. 6). Posts 22A adjacent the edge of the field of view of the reflected image with the present invention (FIG. 6) are also larger, better defined and easier to see than corresponding post members 22B in the reflected image of the prior art mirror (FIG. 7).

Figure 2:
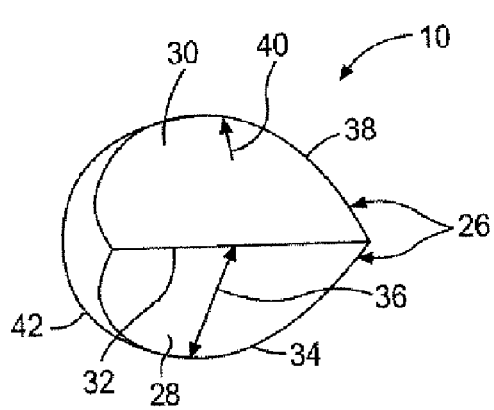
FIG. 2 is rear perspective view of the ellipsoid vehicle mirror assembly illustrated in FIG. 1.
Figure 3:
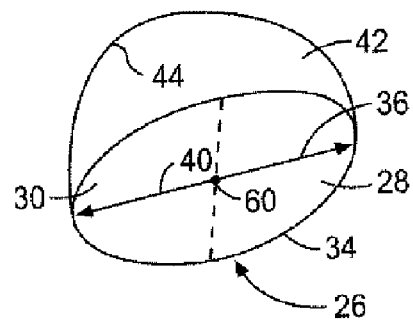
FIG. 3 is an alternate embodiment of an ellipsoid vehicle mirror in accordance with the present invention.

When the perpendicular base embodiment as shown in FIG. 2 is utilized with a constant first base radius of curvature 36, it is preferable that the second base portion 30 is approximately parallel with the vehicle hood plane 78 (see FIG. 1) and the ellipsoid tip point 46 is positioned closer to the vehicle 12 than the first base periphery 38. In this manner, the vehicle 12 is properly relegated to the first proportion image view 72 as shown in FIG. 6, while the second proportion image view 74 covers the entire range of front-of-vehicle to side-of vehicle.

Figure 4A:
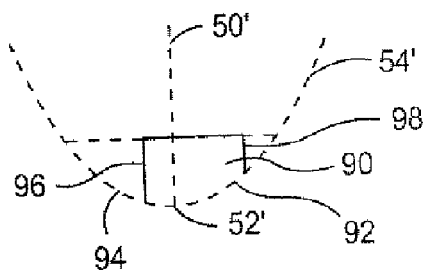
FIG. 4A is an enlarged view of a portion of the mirror depicted in FIG. 4 illustrating a preferred embodiment of the present invention.
Figure 4:
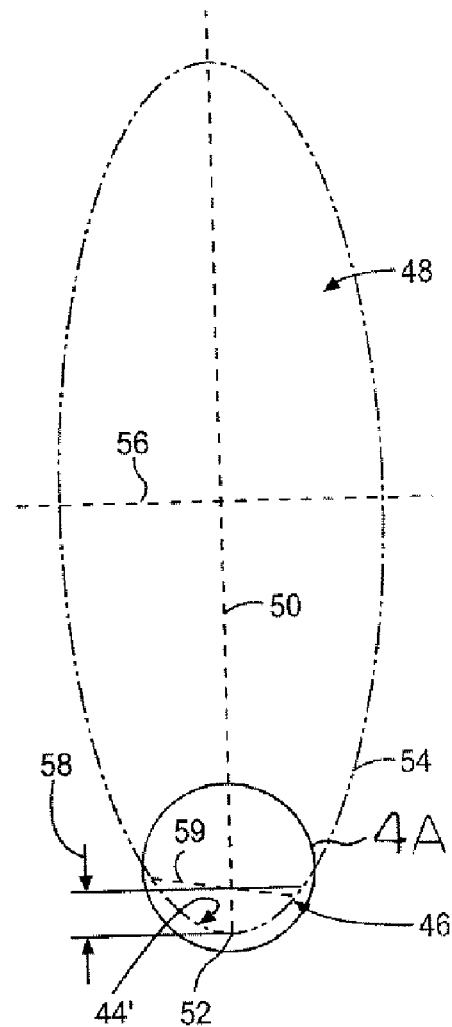
FIG. 4 is a cross-sectional view of the ellipsoid vehicle mirror assembly shown in FIG. 1, the view illustrating the geometric properties of the ellipsoid vehicle mirror.

One preferred mirror lens configuration 90 is shown in FIG. 4A. The curvature 92 along the mid-point of the front surface of the mirror lens 90 follows the curvature of one end 94 of an ellipsoid 54'. The curvature along the surface of the mirror lens transverse to curvature 92 also follows along the curvature of the ellipsoid. The upper and lower surfaces 96 and 98, respectively, of the mirror lens 90 are cut-off as truncated in the manner shown in FIG. 4A.

A schematic depiction of a preferred mirror assembly 100 in accordance with the present invention is shown in FIGS. 8-12. The assembly 100 includes a mirror lens 110, a housing or base member 120, and an elastomeric gasket member 130. As shown in the exploded view in FIG. 12, the base member 120 has an outer rim or recess 122 adapted to hold the outer edges of the mirror lens 110. The gasket member 130 is positioned over the mated lens and base member after they are assembled together. In order to hold the three components tightly together, it is preferable to securely affix the lens to the base member with glue or the like. It is also possible to glue or otherwise securely attach the gasket member over the interface between the base member and lens. The gasket member assists in sealing that interface and prevents moisture, dust, etc. from entering into the center of the mirror assembly.

FIG. 10 also illustrates one of the aspects of the invention. As indicated by the arrows schematically representing the radii of the curvature 112 along the major axis 114 of the surface of the lens 110, the radius R1, at the mid-point 116 is smaller or shorter in length than the radii R2 at the areas of the surface along the major axis 114 away from the mid-point and closer to or adjacent the outer periphery or edges of the lens.

While particular embodiments of the invention have been shown and described, numerous variations and alternative embodiments will occur to those skilled in the arm. Accordingly, it is intended that the invention be limited only in terms of the appended claims.

What is claimed is:

1. A vehicle mirror assembly comprising:
   a housing member;
   a mirror lens member; and
   a gasket member;
   said mirror lens member having a curvature substantially conforming to the configuration of an end of an ellipsoid;
   said mirror lens member having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

2. The vehicle mirror assembly as described in claim 1, wherein said mirror lens has upper and lower edges which are truncated from the shape of the outer periphery at the end of an ellipsoid.

3. The vehicle mirror assembly as described in claim 2 wherein said mirror lens has a varying radius of curvature along its major axis, the radius of curvature increasing adjacent the outer edges of said minor lens.

4. The vehicle mirror assembly as described in claim 1, wherein said mirror lens has a varying radius of curvature along its major axis, the radius of curvature increasing adjacent the outer edges of said mirror lens.

5. A mirror lens for a mirror assembly, said mirror lens having a curvature substantially conforming to the configuration of an end of an ellipsoid;
   said mirror lens having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

6. The vehicle mirror assembly as described in claim 5, wherein said mirror lens has upper and lower edges which are truncated from the shape of the outer periphery at the end of an ellipsoid.

7. The vehicle mirror assembly as described in claim 6 wherein said mirror lens has a varying radius of curvature along its major axis, the radius of curvature increasing adjacent the outer edges of said mirror lens.

8. The vehicle mirror assembly as described in claim 5, wherein said mirror lens has a varying radius of curvature along its major axis, the radius of curvature increasing adjacent the outer edges of said mirror lens.

9. A method of making a mirror assembly, said method comprising the steps of:
   providing a housing member;
   forming a mirror lens member with a curvature substantially conforming to the configuration of an end of an ellipsoid;
   positioning said mirror lens member onto said housing member; and
   positioning an elastomeric gasket member covering the joint between said housing member and said mirror lens member;
   said mirror lens member having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

10. The method of making a mirror assembly as defined in claim 9, wherein said mirror lens has upper and lower edges which are truncated from the shape of the outer periphery at the end of an ellipsoid.

11. The method of making a mirror assembly as defined in claim 10 wherein said mirror lens has a varying radius of curvature along its major axis, the radius of curvature increasing adjacent the outer edges of said mirror lens.

12. The method of making a mirror assembly as defined in claim 9, wherein said mirror lens has a varying radius of curvature along its major axis, the radius of curvature increasing adjacent the outer edges of said mirror lens.

13. A vehicle mirror assembly comprising:
a housing member;
a mirror lens member; and
a cover member positioned adjacent the mating interface between said housing member and said mirror lens member;
said mirror lens member having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

14. The vehicle mirror assembly as described in claim 13 wherein said mirror lens has upper and lower edges which are substantially parallel to one another.

15. The vehicle mirror assembly as described in claim 13 wherein said mirror lens has a varying radius of curvature along its major axis, the radius of curvature increasing adjacent the outer edges of said mirror lens.

16. The vehicle mirror assembly as described in claim 13 wherein said mirror lens has a curvature substantially conforming to the configuration of an end of an ellipsoid.

17. The vehicle mirror assembly as defined in claim 13 wherein said cover member is a sealing member covering the joint between said housing member and said mirror lens member.

18. The mirror assembly as defined in claim 17 wherein said sealing member is an elastomeric gasket member.

19. A mirror lens for a mirror assembly, said mirror lens having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

20. The vehicle mirror assembly as described in claim 19, wherein said mirror lens has upper and lower edges which are substantially parallel to one another.

21. The vehicle mirror assembly as described in claim 19, wherein said mirror lens has a varying radius of curvature along its major axis, the radius of curvature increasing adjacent the outer edges of said mirror lens.

22. The vehicle mirror assembly as described in claim 19, wherein said mirror lens has a curvature substantially conforming to the configuration of an end of an ellipsoid.

23. The mirror assembly as defined in claim 19 further comprising a base member and a sealing member.

24. A method of making a mirror assembly, said method comprising the steps of:
providing a housing member;
forming a mirror lens member;
positioning said mirror lens member onto said housing member; and positioning a sealing member substantially covering the joint between said housing member and said mirror lens member;
said mirror lens member having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

25. The method of making a mirror assembly as defined in claim 24, wherein said mirror lens has upper and lower edges which are truncated from the shape of the outer periphery at the end of an ellipsoid.

26. The method of making a mirror assembly as defined in claim 24, wherein said mirror lens has a varying radius of curvature along its major axis, the radius of curvature increasing adjacent the outer edges of said mirror lens.

27. The method of making a mirror assembly as defined in claim 24 wherein said sealing member is an elastomeric member.

28. The method of making a mirror assembly as defined in claim 24 wherein said mirror lens has a curvature substantially conforming to the configuration of an end of an ellipsoid.

29. A cross-view mirror assembly for a vehicle, said cross-view mirror assembly comprising:
a housing member having an opening on at least one said thereof;
a mirror lens member positioned on said housing member covering said opening;
a cover member positioned on the interface between said housing member and said mirror lens member; and
a bracket member for attaching said mirror assembly to a vehicle;
said mirror lens member having a curved surface with top and bottom edges and two side edges;
said top and bottom edges being elongated and substantially parallel to one another;
said mirror lens member having a major axis and a minor axis perpendicular to said major axis, said major axis having a first radius of curvature along a portion including the midpoint of the axis, and a second radius of curvature along portions adjacent the ends of the major axis, said first radius of curvature being smaller than said second radius of curvature.

* * * * *